(12) United States Patent
Hohmann et al.

(10) Patent No.: US 9,083,329 B2
(45) Date of Patent: Jul. 14, 2015

(54) CIRCUIT ARRANGEMENT AND METHOD FOR SUPPLYING A HIGH-POWER FUNCTIONAL COMPONENT WITH HIGH-VOLTAGE PULSES

(75) Inventors: Maik Hohmann, Holzkirchen (DE); Frank Schumann, Sauerlach (DE); Reinhard Niejodek, Munich (DE)

(73) Assignee: Transtechnik GmbH & Co. KG, Holzkirchen (DE)

( * ) Notice: Subject to any disclaimer, the term of this patent is extended or adjusted under 35 U.S.C. 154(b) by 868 days.

(21) Appl. No.: 13/202,278

(22) PCT Filed: Jul. 7, 2009

(86) PCT No.: PCT/EP2009/004899
§ 371 (c)(1),
(2), (4) Date: Oct. 31, 2011

(87) PCT Pub. No.: WO2010/108524
PCT Pub. Date: Sep. 30, 2010

(65) Prior Publication Data
US 2012/0038224 A1      Feb. 16, 2012

(30) Foreign Application Priority Data

Mar. 25, 2009   (DE) .......................... 10 2009 014 297
Jun. 10, 2009   (DE) .......................... 10 2009 025 030

(51) Int. Cl.
*H02M 3/06*       (2006.01)
*H03K 3/57*       (2006.01)

(52) U.S. Cl.
CPC ....................... *H03K 3/57* (2013.01)

(58) Field of Classification Search
USPC ............................ 307/54, 109, 112, 113, 140
See application file for complete search history.

(56) References Cited

U.S. PATENT DOCUMENTS 4,594,634 A *   6/1986   Schminke ..................... 361/100
7,269,037 B2   9/2007   Marquardt (Continued)

FOREIGN PATENT DOCUMENTS

EP      0134505 A1    3/1985
EP      1176720 A2    1/2002

(Continued)

OTHER PUBLICATIONS

A. Lesnicar, (An Innovative Modular Multilevel Converter Topology Suitable for a Wide Power Range), 2003, IEEE.*

(Continued)

*Primary Examiner* — Rexford Barnie
*Assistant Examiner* — Xuan Ly
(74) *Attorney, Agent, or Firm* — Studebaker & Brackett PC (57) ABSTRACT

A circuit arrangement for supplying a high-power functional component with high-voltage pulses, having two input terminals for applying an input voltage, two output terminals for connection to a high-voltage terminal contacts of the high-power functional component, a plurality of charge storage modules, which each contain a capacitive element, and which are connected in series via at least one first switching device to the input terminals and via at least one second switching device to the output terminals, and a control device for activating the individual charge storage modules and the first and second switching devices. The charge storage modules and the control device are implemented such that in a charging phase, the first switching device is closed and the capacitive elements of the charge storage modules are connected successively individually or in groups in series to a charging voltage, then in a discharging phase the first switching device is opened and the charge storage modules are disconnected from the charging voltage and the second switching device is closed and at least a part of the capacitive elements of the charge storage modules are discharged, if a high-power functional component is properly connected to the output terminals, to form a voltage pulse. Furthermore, set forth is a method for supplying a high-power functional component with high-voltage pulses.

15 Claims, 6 Drawing Sheets

(56) References Cited

U.S. PATENT DOCUMENTS

| 7,989,987 | B2 | 8/2011 | McDonald |
| 2008/0036301 | A1 | 2/2008 | McDonald |

FOREIGN PATENT DOCUMENTS

| EP | 1497911 | A2 | | 1/2005 |
| EP | 1553686 | A1 | * | 7/2005 |
| EP | 1553686 | A1 | | 7/2005 |

OTHER PUBLICATIONS

A. Lesnicar; "An Innovative Modular Multilevel Converter Topology Suitable for a Wide Power Range"; Power Tech Conference Proceedings, 2003; IEEE Bologna, vol. 3, pp. 23-26; Jun. 2003.

H. Kassner; International Search Report; PCT/EP2009/004899; Apr. 1, 2010.

* cited by examiner

CIRCUIT ARRANGEMENT AND METHOD FOR SUPPLYING A HIGH-POWER FUNCTIONAL COMPONENT WITH HIGH-VOLTAGE PULSES

The present invention relates to a circuit arrangement and a method for supplying a high-power functional component, in particular a klystron or a kicker magnet, with high-voltage pulses.

For many experiments in high-energy physics, particle accelerators, such as storage rings, are necessary, in which elementary particles are brought to high energies by acceleration (sometimes up to nearly the speed of light). The energy of these particles can be in the GeV or TeV range. Various high-power functional components are necessary for constructing such particle accelerators, in order to accelerate the particles to a sufficiently great extent in the desired direction. These high-power functional components include, inter alia, klystrons, with the aid of which, inter alia, microwaves are generated, which are used for accelerating particles in cyclotrons or linear accelerators. Currently, short voltage pulses between 20 and approximately 120 kV having currents of 10 to approximately 50 A are required for operating a klystron. Sufficiently high-performance pulses of approximately 100 kV or more are generated with the aid of a transformer for this purpose in special circuit arrangements from an input voltage of approximately 10 kV. These circuit arrangements are constructed using a plurality of assemblies which are required, inter alia, for shaping the required output pulse. The construction is adapted to the respective klystron and the special pulse repetition time, pulse height, and pulse shape required thereby. Further high-power functional components used in large particle accelerators are so-called "kicker magnets", which are employed in order to kick the accelerated particles out of a particle beam and therefore deflect them into another accelerator, for example. These kicker magnets also require very high and short voltage pulses, which relatively expensive circuits are currently used to generate.

It is an object of the present invention to specify an improved circuit arrangement and an improved method for supplying such high-power functional components with high-voltage pulses.

This object is achieved, on the one hand, by a circuit and, on the other hand, by a method set forth below.

The circuit arrangement according to the invention has
two input terminals for applying an input voltage,
two output terminals for connecting to high-voltage terminal contacts of the high-power functional components,
a plurality of charge storage modules, which each contain a capacitive element, and which are connected in series via at least one switching device, the charge switching device, to the input terminals and via at least one second switching device, the discharge switching device, to the output terminals, and
a control device for activating the individual charge storage modules and the first and second switching devices.

The charge storage modules and the control device are implemented such that, in a charging phase, the first switching device is closed and the capacitive elements of the charge storage modules are successively connected individually or in groups in series to a charging voltage provided via the input terminals, e.g., the input voltage for the circuit arrangement, and then in a discharging phase, the first switching device is opened and therefore the charge storage modules are disconnected from the charging voltage, and the second switching device is closed and at least a part of the capacitive elements of the charge storage modules, with a high-power functional component properly connected to the output terminals, are discharged to form a defined voltage pulse.

The method according to the invention for activating a high-power functional component using high-voltage pulses accordingly comprises the following method steps:
charging a plurality of charge storage modules, which each contain a capacitive element, in a charging phase, the capacitive elements of the charge storage modules being connected in series to a charging voltage successively individually or in groups (i.e., connected in series),
disconnecting the charged charge storage modules from the charging voltage,
and discharging the charge storage modules in a discharging phase in the form of a defined voltage pulse, at least a part of the charged capacitive elements of the charge storage modules being connected in series to the output terminals of the circuit arrangement
and therefore the high-voltage terminal contacts of the high-power functional component.

A high-power functional component is to be understood here to include functional components which are required in high-energy physics laboratories, for example, like the above explained particle accelerators and require a corresponding pulsed high-voltage supply having voltages of preferably greater than 12 kV. These include in particular the mentioned kicker magnets or klystrons or functional components containing such devices for accelerating the particles in the field of high-energy physics. However, it is to be expressly noted that a klystron activated according to the invention can also be used for other purposes in which corresponding high-frequency signals are required.

The claimed invention and the following description contain particularly advantageous refinements and embodiments of the invention, the method according to the invention also being able to be refined analogously to the dependent claims with respect to the circuit arrangement and vice versa.

The control device for activating the individual charge storage modules and the charge storage modules are preferably implemented such that capacitive elements of the charge storage modules can be switched in or out in a controlled manner individually or in groups in the charging phase and/or to generate a defined voltage pulse in the discharging phase. Through controlled switching in or out of individual capacitive elements of the charge storage modules or groups of capacitive element of the charge storage modules during the pulse generation, the pulse shape can be exactly controlled. In particular, it can be ensured by successively switching in capacitive elements of the charge storage modules that an essentially constant voltage can be maintained during the entire pulse duration.

At least a part of the charge storage modules particularly preferably each have separately activatable switching elements, which are implemented and situated so that the capacitive element of a charge storage module is connected to adjacent charge storage modules within the serial circuit or an end point of the serial circuit, or the capacitive element of a charge storage module is bypassed within the serial circuit. Arbitrary switching in (i.e., the capacitive element is in the chain) or switching out (i.e., the capacitive element is bypassed) of individual capacitive elements in the serial chain of the charge storage modules is thus possible in a simple manner, without interrupting the chain. The activatable switching elements are preferably situated so that the respective capacitive element of the charge storage modules can be short-circuited, optionally via a discharging load, for example, a resistor, in order to discharge it in a controlled manner.

To activate the switching elements, at least a part of the charge storage modules each have control units connected to the control device.

In addition, at least a part of the charge storage modules particularly preferably each have a measuring unit for measuring a measured value which represents the charge state of the capacitive element, for example, a voltage over the respective capacitive element. The capacitive elements of the charge storage modules can then be switched in or out in the charging phase and/or in the discharging phase as a function of a charge currently stored in the respective capacitive element or the current voltage. The measuring unit can preferably be integrated in the respective control unit of the affected charge storage module. However, it can also be implemented separately.

The control units and/or the measuring units of the charge storage modules are preferably each connected via a non-galvanic connection, preferably via optical waveguides, to the control device, for decoupling the high voltage from the control device and for decoupling the charge storage modules among one another on the side of the control line.

The first switching device and/or the second switching device preferably comprise a chain of power switches connected in series, preferably thyristors, particularly preferably a so-called IGCT stack (IGCT=Integrated Gate Commutated Thyristor). Such switching devices can also switch high powers particularly rapidly and reliably. The use of suitable power transistors such as MOSFETs or IGBTs (Insulated Gate Bipolar Transistor) would also optionally be possible.

In a preferred refinement of the invention, the circuit arrangement has a plurality of module groups connected in parallel to one another with respect to the input terminals and the output terminals. These module groups each in turn comprise a plurality of charge storage modules connected in series, which are connected to the parallel circuit of the module groups in each case via at least one first switching device to the input terminals and in each case via at least one second switching device to the output terminals.

The control device is preferably implemented such that the first switching devices and the second switching devices of various module groups are switched so that the module groups are in a charging phase and a discharging phase offset to one another. I.e. for example, in the case of a circuit arrangement having two module groups connected in parallel, one of the module groups is charged while the other module group is alternately discharged and vice versa. In the case of more than two module groups, these may correspondingly be cyclically charged and discharged again. Through the use of multiple parallel module groups, which are disconnectable individually from the charging voltage via the first switching devices and are individually connectable to the supply terminals of the high-power function components via the second switching devices, the high-voltage pulses can be provided in shorter time intervals, i.e., overall a sequence of high-voltage pulses can be delivered whose duty cycle can be significantly higher than using only one module group. With a sufficiently high number of module groups, the duty cycle can even be increased so much in the extreme case that a quasi-DC voltage (composed of high-voltage pulses of the individual module groups following one another in rapid succession) is provided at the output.

The invention is explained once again hereafter with reference to the appended figures on the basis of exemplary embodiments. Identical components are each provided with the same reference numerals in the various figures. In the figures.

Figure 1:
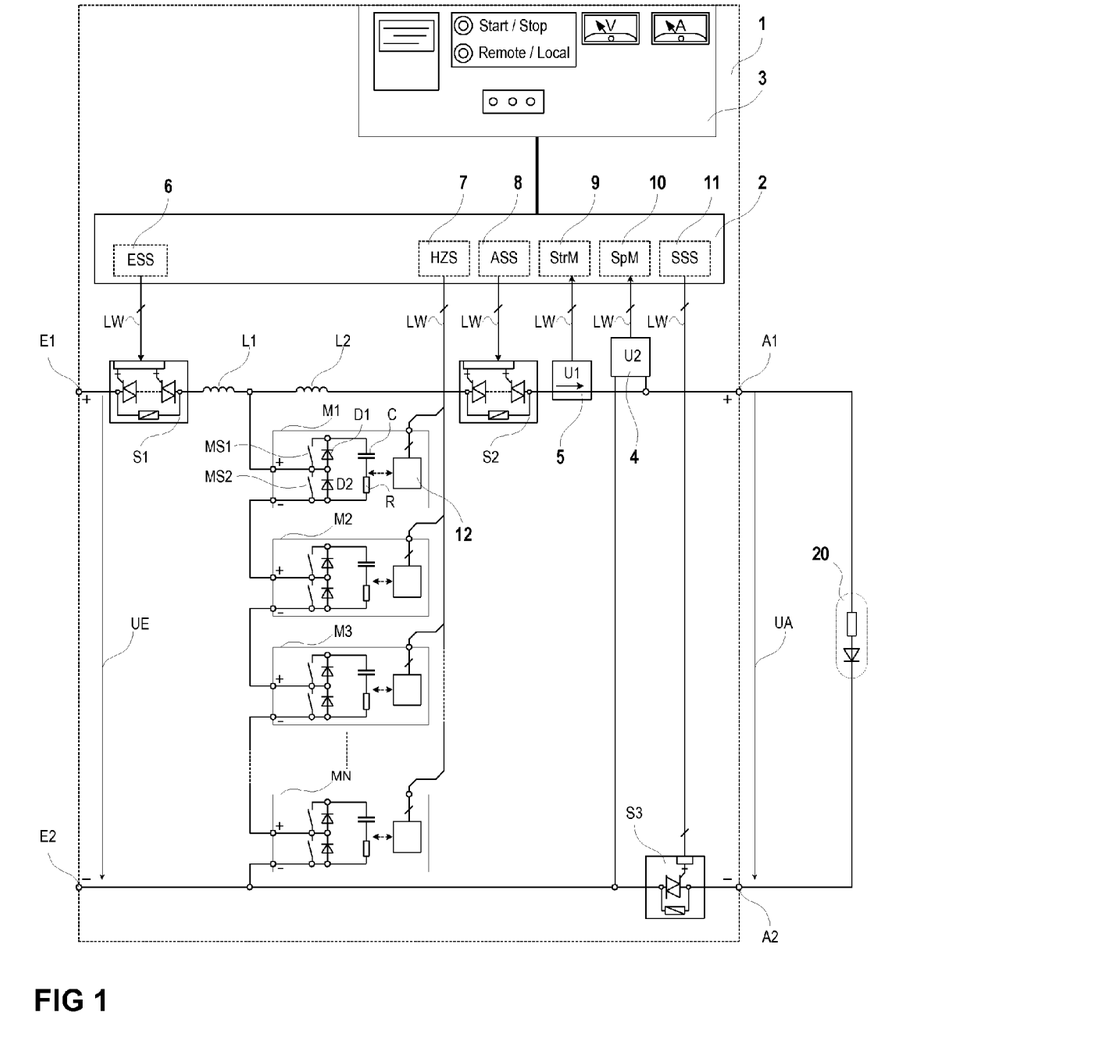
FIG. 1 shows a block diagram of an exemplary embodiment of a circuit arrangement according to the invention for activating a klystron.
Figure 2:
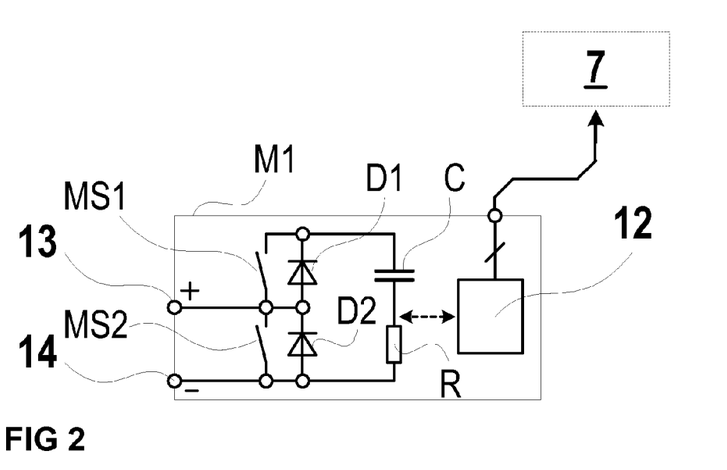
FIG. 2 shows an enlarged schematic circuit diagram of an exemplary embodiment of a charge storage module for a circuit arrangement according to FIG. 1.
Figure 3:
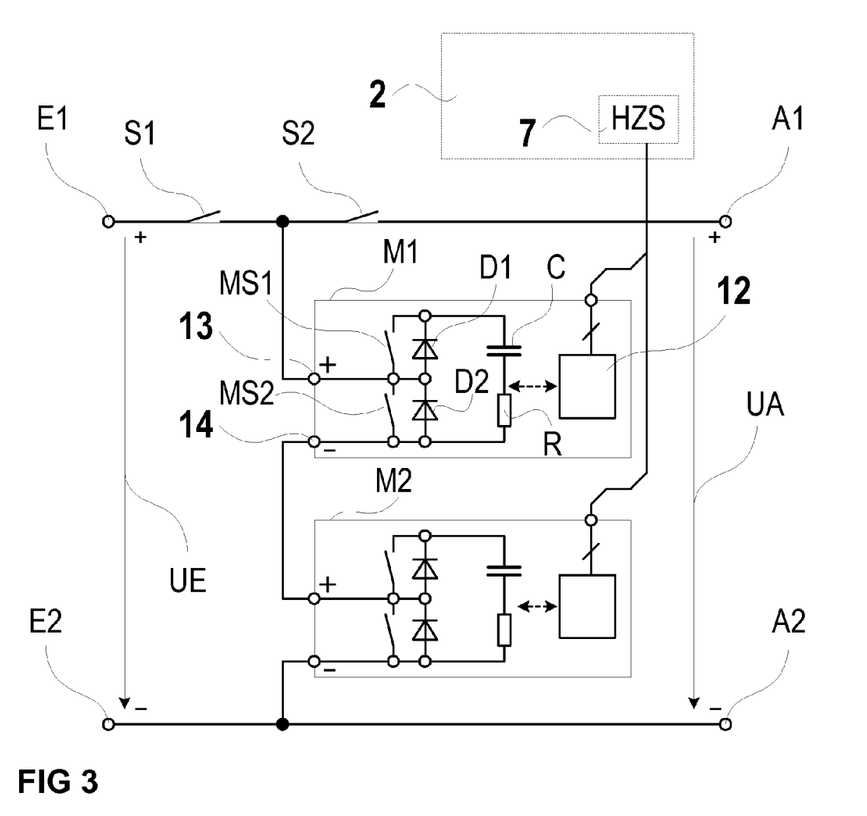
FIG. 3 shows a block diagram of the circuit arrangement according to FIG. 1, which is reduced to a few components, to explain the functional principle.

The klystron high-voltage supply 1 described on the basis of FIGS. 1-3, also referred to as "HSV" 1 in short hereafter, is used for modulating klystrons, as are employed in research centers in connection with linear accelerators.

A concrete exemplary embodiment of an HSV 1 according to the invention implemented on the basis of the figures is capable of maintaining 10 times per second (maximum), a pulse of
100 kV voltage (maximum) at
24 A maximum current flow over a period of time of
10 ms (maximum).

The electrical output voltage implemented during a pulse is at most 2.4 MW at an energy of 24 kWs. The average electrical output voltage implemented using the mentioned data is at most 240 kW.

All listed values are maximum values, i.e., the actual effective values are adjustable in this exemplary embodiment—as explained hereafter. Thus, for example, the voltage level can be selected in broad limits, e.g., between 20 and 100 kV. Pulse time, pulse repetition rate, and pulse shape may also be preselected. However, the invention is otherwise not restricted to these maximum values, but rather corresponding circuit arrangements having substantially higher or lower maximum values can readily be implemented.

The HSV 1 is supplied on the input side at its input terminals E1, E2 with 11 kV DC voltage.

FIG. 1 shows the block diagram of the HSV 1 having the klystron 20 connected at the output side to the output terminals A1, A2 of the HSV 1. The klystron 20 is only schematically shown in FIG. 1 in the form of a replacement circuit diagram (ohmic resistor having downstream diode).

A core part of the HSV 1 is a series circuit of N charge storage modules M1, M2, . . . , MN. The index "N" indicates that this can fundamentally be an arbitrary number of charge storage modules M1, M2, . . . , MN connected one after another. In the present case, this is a series circuit of 180 charge storage modules M1, M2, . . . , MN. These charge storage modules M1, M2, . . . , MN are implemented here in a preferred form as two-terminal modules having two terminals 13, 14. Therefore, they are also referred to hereafter as two-terminal modules M1, M2, . . . , MN.

Each two-terminal module M1, M2, . . . , MN contains a capacitive energy store (capacitor) C as a core part, which may be charged and also discharged in a targeted manner. For this purpose, each two-terminal module M1, M2, . . . , MN is equipped with a separate electronic module controller 12, which may be addressed and queried in a targeted manner by a control device 2 described hereafter, in the form of a central main control unit 2 here. Alternatively, a two-terminal module could additionally also contain multiple energy stores, e.g., capacitors connected in parallel.

The N charge storage modules M1, M2, . . . , MN are each connected in series via a first switching device S1 to the input terminals and via a second switching device S2 to the output terminals. I.e., the chain of charge storage modules M1, M2, . . . , MN is connected on one side, i.e., at one end point of the chain (the upper path in FIG. 1), via a first switching device S1, referred to hereafter as input switch S1, to the first input terminal E1, and is connected on the other side, i.e., at the other end point of the chain (the lower path in FIG. 1), to the second input terminal E2 or to ground. The input switch S1 switches the input voltage of 11 kV to the series circuit of the two-terminal modules M1, M2, . . . , MN. The input switch S1 is an electronic switch and can be implemented, for example, as an IGCT stack (=a plurality of IGCT connected in series—in accordance with the voltage to be switched). Furthermore, the chain of charge storage modules M1, M2, . . . , MN is connected on one side (the upper path in FIG. 1 again) via a second switching device S2, referred to hereafter as output switch S2, to the first output terminal A1 and, on the other side (the lower path in FIG. 1 again), here via a safety switch S3, to the second output terminal A2 for connecting the cathode of the klystron. The output switch S2 and the safety switch S3 are also implemented as electronic switches, e.g., as an IGCT stack.

In order that the 11 kV input voltage side and the 100 kV output voltage side are not connected to one another, an electronic lock ensures that the output switch S2 is always open (=blocking) when the input switch S1 is closed (conductive) and the input switch S1 is always open (=blocking) when the output switch S2 is closed (conductive). The safety switch S3 is used as an emergency shutdown element for the klystron if the output switch S2 should fail.

As further components, the circuit arrangement 1 contains HF throttles L1, L2 for improving the operating properties of the HSV 1 in connection with the modulation of the klystron 20 (suppression of klystron feedback). In the output circuit, connected downstream from the output switch S2, a current meter (U1) 5 and a voltage meter (U2) 4 are additionally situated. The values measured by the current meter 5 and by the voltage meter 4 can be digitized in the respective device 4, 5 by means of an internal analog-digital converter, in order to be serially transmitted therefrom via optical wave guide LW to the central main control unit 2, for example.

Because of the high occurring voltages, all other measuring and control signals are additionally also preferably transmitted via optical wave guide LW to the main control unit 2 for the secure decoupling of high voltage and low voltage.

The main control unit 2 in FIG. 1 controls the sequence of the pulse generation. For this purpose, it is connected to all two-terminal modules M1, M2, . . . , MN, measuring devices 4, 5, and electronic switches S1, S2, S3 via the optical waveguides LW. It receives digital measurement and status signals from the mentioned components of the HSV 1, evaluates them in its internal computer, and then outputs the appropriate digital control signals to the process. In addition, the central main control unit 2 monitors the HSV 1 for operational reliability. For this purpose, it monitors the safety switch (personnel protection) installed in the device and limits the occurring operating variables so that the allowed limiting values are not exceeded (klystron protection and self-protection).

The main control unit 2 has a computer (microprocessor), on which an array of software modules 6, 7, 8, 9, 10, 11 is implemented. These software modules 6, 7, 8, 9, 10, 11 are supplied with data via corresponding inputs and trigger control procedures via corresponding outputs.

One of these software modules is the input switch controller (ESS) 6. It receives operating signals and status messages from other components of the HSV and outputs the control signals resulting from the check by the software routine to the input switch S1, in order to open or close it. The input switch controller 6 and optionally further software modules of the main control unit 2 also receive status messages of the input switch S1 and therefore monitor its function.

A further one of the software modules is the main two-terminal controller (HZS) 7. It receives values of the respective capacitor voltage and various status signals about the operating status from the two-terminal modules M1, M2, . . . , MN, as explained hereafter. The HZS links these data and, in all two-terminal modules, controls the internal switch elements MS1, MS2, which are also described hereafter, and which are also referred to hereafter as module switches MS1, MS2.

A further one of the software modules is the output switch controller (ASS) 8. It receives operating signals and status messages from other components of the HSV and outputs the control signals resulting from the check by the software routine to the output switch S2, in order to open or close it. The output switch controller 8 and optionally further software modules of the main control unit 2 also receive status messages of the output switch S2 and therefore monitor its function.

A further one of the software modules is the current measuring unit (StrM) 9. It accepts the digital value formed by the current meter 5 via optical waveguide receiver, conditions it, and provides it to the corresponding software routines.

A further one of the software modules is the voltage measuring unit (SpM) 19. It accepts the digital value formed by the voltage meter 4 via optical wave guide receiver, conditions it, and provides it to the corresponding software routines.

A further one of the software modules is the safety switch controller (SSS) 11. It receives status messages from the HSV and outputs the control signals resulting from the check by the software routine to the safety switch S3, in order to open or close it.

The main control unit 2 and therefore the entire circuit arrangement 1 can be monitored and controlled by an operator via a user interface 3 having various operating elements and display elements.

FIG. 2 shows a somewhat enlarged view of the circuit in one of the two-terminal modules M1, M2, . . . , MN. It comprises a capacitor C and a charging and discharging circuit for this capacitor C having two module switches MS1, MS2 connected in series. A preferably low-resistance (e.g., in the magnitude of 1 ohm) resistor R can, as shown in FIG. 2, be connected upstream from the capacitor C. Such an energy store two-terminal module 2 is described, for example, in the article "An innovative modular multilevel converter topology suitable for a wide power range" by Lesnicar, A. and Marquardt R. in Power Tech Conference Proceedings, 2003 IEEE Bologna Volume 3, Issue, 23-26 Jun. 2003 Page(s): 6 pp. Vol. 3, to the content of which reference is made here.

The mode of operation of such a two-terminal module M1, M2, . . . , MN is as follows:

If one applies a DC voltage with the correct polarity to the module inputs 13 (+) and 14 (−), and ensures that the module switches MS1 and MS2 are open, the capacitor C is charged via the diode D1. If one removes the charging voltage from the input terminals 13, 14, the capacitor C remains charged. After closing the first module switch MS1 (discharging switch), the capacitor C can be discharged again via the module inputs 13 and 14. The input of the two-terminal module can be short-circuited using the second module switch MS2 (bypass switch). The module controller 12 actuates the module switches MS1 and MS2 upon instruction of the main control unit. The module controller 12 operates without auxiliary energy. It is supplied via the module inputs 13, 14 or from the capacitor C, if it is charged, if there is no input voltage.

Reference is made to FIG. 3 to explain the fundamental mode of operation of the entire circuit arrangement. This figure merely shows two two-terminal modules M1, M2 connected one after the other. This is the simplest case of a series circuit and is to be used to explain the fundamental behavior of a series circuit of the two-terminal modules M1, M2, ..., MN.

I. Charging Phase (Charge Capacitors C):

The input switch S1 is closed (ON) and the output switch S2 is then automatically open (OFF), controlled by the central main control unit 2. The main control unit 2 must ensure the locking of the input switch S1 and the output switch S2.

The capacitors C in the two two-terminal modules M1, M2 are now charged using the input voltage UE via the diodes D1. The two-terminal modules M1, M2 form a capacitor voltage divider: the voltage ½ UE is applied to each two-terminal module M1, M2. After a sufficiently long time, each of the two capacitors C is charged to the voltage ½ UE. The bypass switch MS2 in the two-terminal module M2 is closed. Therefore the entire voltage UE is now applied to the two-terminal module M1. The capacitor C in the two-terminal module M1 is therefore charged further to the voltage UE. It is assumed that the capacitors C can tolerate this voltage. Subsequently, the bypass switch MS2 in the two-terminal module M2 is opened again and the bypass switch MS2 in the two-terminal module M1 is closed. The entire voltage UE is now applied to the two-terminal module M2. The capacitor C in the two-terminal module M2 is therefore also charged further to the voltage UD. Subsequently, the bypass switch MS2 in the two-terminal module M1 is opened again. Each of the capacitors C in the series circuit is now charged to UE.

II. Discharging Phase (Voltage Buildup at the Output and Discharge of Capacitors C):

The main control unit 2 opens the input switch S1. The 11 kV input is thus disconnected from the series circuit. The main control unit 2 now closes the discharge switch MS1 in both two-terminal modules M1, M2. The output voltage 2·UE is now applied to the output terminal A1, or between output terminals A1, A2. After closing the output switch S2, the series circuit of the two-terminal capacitors can be discharged via the klystron.

Fundamentally, an arbitrarily large number of two-terminal modules M1, M2, ..., MN may thus be connected in series. In the case of a chain of N two-terminal modules M1, M2, ..., MN, as is provided in the exemplary embodiment according to the invention shown in FIG. 1, the following possibilities thus result:

During the charging phase, just enough capacitors C can be charged by intentional bypassing of two-terminal modules M1, M2, ..., MN so that the maximum permissible voltage at the respective capacitor C is not exceeded.

For example, if the capacitors can be loaded using at most 1000 V and the input voltage is 11,000 V, for example, at least 11 capacitors C must always be charged, if maximum output voltage is required (if not, it would suffice to only charge the capacitors C to a voltage of less than 1000 V). For example, if the series circuit comprises 180 two-terminal modules M1, M2, ..., MN, at most 169 two-terminal modules M1, M2, ..., MN can be bypassed by the main control unit 2 during the charging (i.e., the bypass switch MS2 can be closed in these two-terminal modules M1, M2, ..., MN).

With 180 capacitors or two-terminal modules M1, M2, ..., MN in series, an output voltage UA of at most 180 kV may theoretically be achieved, in that all discharge switches MS1 in the two-terminal modules M1, M2, ..., MN are closed. This voltage would only be available at the time t=0 upon discharge via the klystron 20; the voltage would then drop exponentially in accordance with the time constant RC, which is determined by the total capacitance of all capacitors and the ohmic resistors in the circuit Therefore, all two-terminal modules M1, M2, ..., MN are preferably not switched in simultaneously upon discharge, but rather only gradually individually or in groups. The entire circuit arrangement 1 is therefore designed by the selection of the capacitors C and the number of the two-terminal modules M1, M2, ..., MN so that the maximum output voltage is greater than the voltage which the voltage pulse for activating the klystron 20 is to have. Specifically, if only a lesser voltage is required, in the above-mentioned example of 180 two-terminal modules, for example, only an output pulse of 100 kV, under the presumption that all capacitors C of the series circuit are charged to 1000 V, at the time t=0 only 100 of the two-terminal modules M1, M2, ..., M100 are switched to discharge using the discharge switch MS1, and 80 further two-terminal modules M101, M102, ..., M180 are available for refreshment. Whenever the high voltage at the output has dropped below a specific value, it may be increased again by connecting new "fresh" two-terminal modules until the reserve of 80 modules is "used up". The pulse droop of the output pulse may thus be avoided. For example, if one starts with 100 capacitors in series, each of which is charged to 1000 V, the initial voltage is 100,000 V. As soon as the output voltage has dropped to 99,000 V, a further capacitor, which is still fully charged to 1000 V, is also connected into the series. The output voltage is now again 100,000 V for an infinitesimally short period of time, in order to then drop exponentially again (with a slightly different time constant RC, since now 101 capacitors are in series, whereby the total capacitance of the series circuit changes; in addition, 101 resistors are now also in series, whereby the total resistance changes).

The module control units 12 each have an integrated measuring unit, using which the respective current voltage over the associated capacitor C can be measured. This measured value can be transmitted via the control line implemented by the optical wave guide LW to the main control unit 2. It can thus be ensured that the capacitors C are charged to the desired value, and in particular are not overcharged. The knowledge of the current charge of the main control unit 2 is also particularly of interest, however, if the two-terminal modules M1, M2, ..., MN have not all been completely discharged in the discharging phase. The main control unit 2 can then activate the two-terminal modules M1, M2, ..., MN in an "intelligent manner" with the aid of a suitable computational algorithm on the basis of these values in the following charging phase, so that they are all charged to the desired voltage value independently of their residual charge state.

Figure 4:
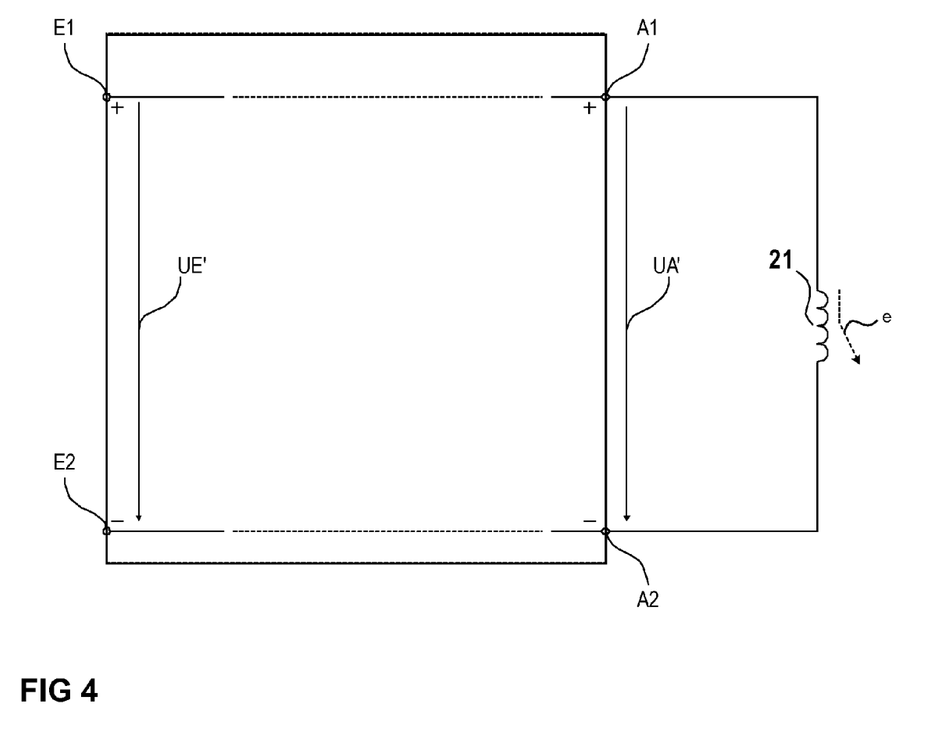
FIG. 4 shows a block diagram of an activation of a kicker magnet using a circuit arrangement according to the invention.

FIG. 4 very schematically shows another application of a circuit arrangement 1 according to the invention for activating a kicker magnet 21 on a steel pipe (not shown). Such a kicker magnet 21 is often implemented in the form of an electromagnet having conductors situated parallel to the particle beam e to be deflected. Using this kicker magnet 21, a short magnetic field pulse, which typically only lasts a few microseconds, is generated, by which a particle beam e in the steel pipe is briefly deflected. Correspondingly, such a kicker magnet 21 is to be supplied with voltage pulses having a peak voltage of several tens of kilovolts and of a few microseconds in length. The current can be in the range of a few kA and the required energy can be in the range of a few GeV in this case. A circuit arrangement according to the invention constructed as shown in FIGS. 1 to 3 can readily fulfill these conditions using the above-described mode of operation. In order to achieve a sufficient adaptation to the high-power functional components to be activated and to generate the desired pulse having the matching output voltage UA' from the available input voltage UE', reprogramming of the software components of the main control unit 2 and/or the two-terminal modules M1, M2, . . . , MN is sufficient in many cases. The number and/or capacitance of the two-terminal modules M1, M2, . . . , MN and/or the design of the circuit arrangements 1, 2, 3 may optionally also be adapted.

Figure 5:
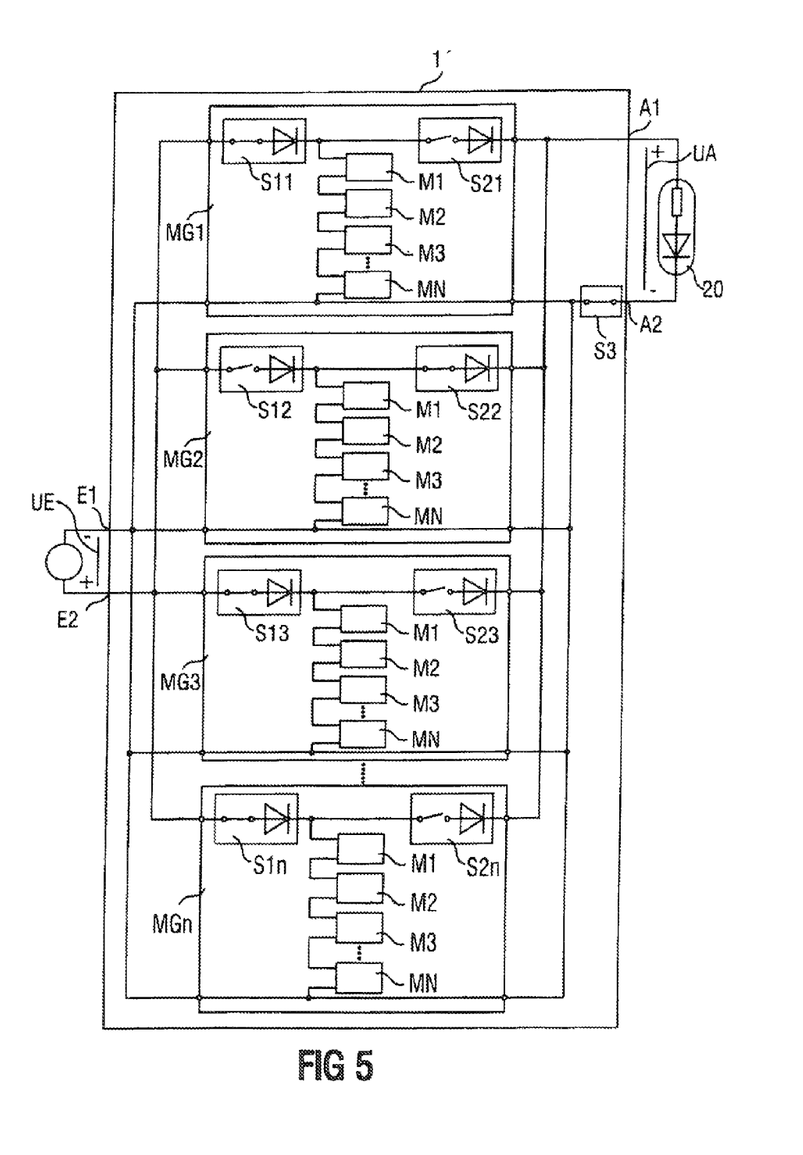
FIG. 5 shows a block diagram of a further exemplary embodiment of a circuit arrangement according to the invention having multiple module groups.

FIG. 5 shows an example of a circuit arrangement 1' having multiple module groups MG1, MG2, MG3, MGn connected in parallel to one another with respect to the input terminals E1, E2 and the output terminals A1, A2. Each of these module groups MG1, MG2, MG3, MGn in turn comprises a chain of charge storage modules M1, M2, . . . , MN connected in series. The individual module groups MG1, MG2, MG3, MGn may each have the same number of charge storage modules M1, M2, . . . , MN, and these may be the same types of charge storage modules M1, M2, . . . , MN having identical capacitances, or also different numbers and types.

The module groups MG1, MG2, MG3, MGn, i.e., the individual chains of charge storage modules M1, M2, . . . , MN of the module groups MG1, MG2, MG3, MGn are each again connected on one side (in FIG. 5 in each case the upper path of each module group MG1, MG2, MG3, MGn) via a first switching device (or an associated input switch) S11, S12, S13, S1n, associated with the respective module group MG1, MG2, MG3, MGn to the first input terminal E1, and are connected on the other side (the lower path in each case in FIG. 5) in each case to the second input terminal E2 or to ground and are therefore connected in parallel with respect to the inputs E1, E2. Furthermore, the chains of charge storage modules M1, M2, . . . , MN of the module groups MG1, MG2, MG3, MGn are connected on one side (the upper path again in each case in FIG. 5) via a second switching device (output switch) S21, S22, S23, S2n, which is associated with the respective module group MG1, MG2, MG3, MGn, to the first output terminal A1 and on the other side (again the lower path in each case in FIG. 5) to the second output terminal A2. The module groups MG1, MG2, MG3, MGn are therefore also connected in parallel with respect to the outputs A1, A2, to which the high-power functional component, a klystron 20 again here, is connected. As in the exemplary embodiments according to FIGS. 1 to 4, the connection to the second output A2 is again performed via a safety switch S3. One safety switch S3 is sufficient for all module groups MG1, MG2, MG3, MGn, i.e., the module groups MG1, MG2, MG3, MGn are connected together in parallel before the safety switch S3. Alternatively or additionally, however, each module group MG1, MG2, MG3, MGn can also be equipped with a separate safety switch. The input switches S11, S12, S13, S1n, the output switches S21, S22, S23, S2n, and the safety switches S3 are each symbolized in FIG. 5 by switches having diodes (to identify the transmission direction). However, they may also be implemented as in the above-described exemplary embodiments as electronic switches, e.g., as an IGCT stack.

FIG. 5 shows a switching state in which the second module group MG2 has just output a high-voltage pulse. Therefore, the associated input switch S12 is open and the output switch S22 is closed. The other module groups MG1, MG3, MGn can be charged in this time, since in each case the associated input switch S11, S13, S1n is closed and the output switch S21, S23, S2n is open.

The control device can be implemented so that it has a main control unit 2, which has separate software modules for activation for each input switch S11, S12, S13, S1n and each output switch S21, S22, S23, S2n as well as for each module group MG1, MG2, MG3, MGn, however. Other arbitrary architectures of the main control unit 2 are also possible, however, e.g., that common software modules are used in each case for activating all input switches S11, S12, S13, S1n and/or for activating all output switches S21, S22, S23, S2n, for example. In particular, a separate main control unit 2 can also be associated with each module group MG1, MG2, MG3, MGn and the main control units are coordinated by a master main control unit, for example, one of the main control units 2 also being able to perceive the function of the master main control unit.

Figure 6:
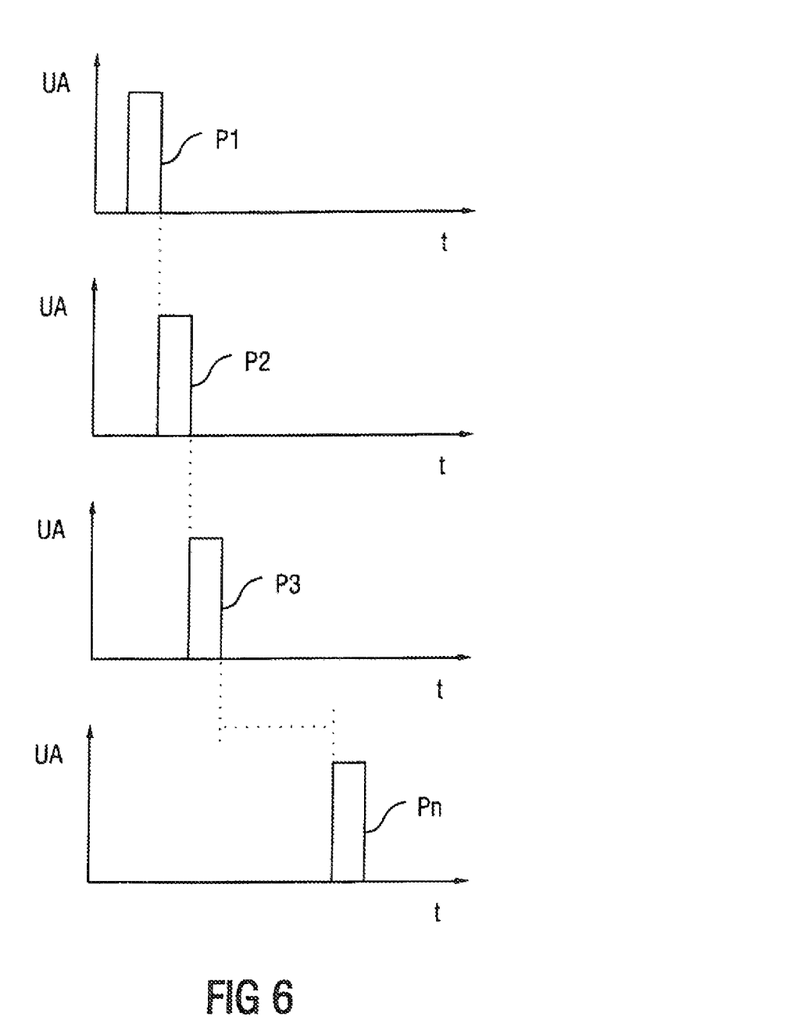
FIG. 6 shows a view of multiple pulse diagrams to explain a possible mode of operation of the circuit arrangement according to FIG. 5.

Using this construction, it is possible to charge one of the module groups MG1, MG2, MG3, MGn simultaneously, while another module group MG1, MG2, MG3, MGn currently outputs a pulse. FIG. 6 shows an illustration in which possible pulse diagrams of output high-voltage pulses P1, P2, P3, Pn of the module groups MG1, MG2, MG3, MGn according to the circuit arrangement 1' shown in FIG. 5 are shown, when the module groups MG1, MG2, MG3, MGn are cyclically discharged and charged successively. In each case, the output voltage UA is plotted over the time t. The activation of the module groups MG1, MG2, MG3, MGn is performed here so that nearly immediately after an end of the pulse P1, P2, P3 of a preceding module group MG1, MG2, MG3, a following module group MG2, MG3, MGn outputs a pulse P2, P3, Pn. The pulses P1, P2, P3, Pn are preferably as rectangular as possible and preferably each have the same height and length $t_M$.

Figure 7:
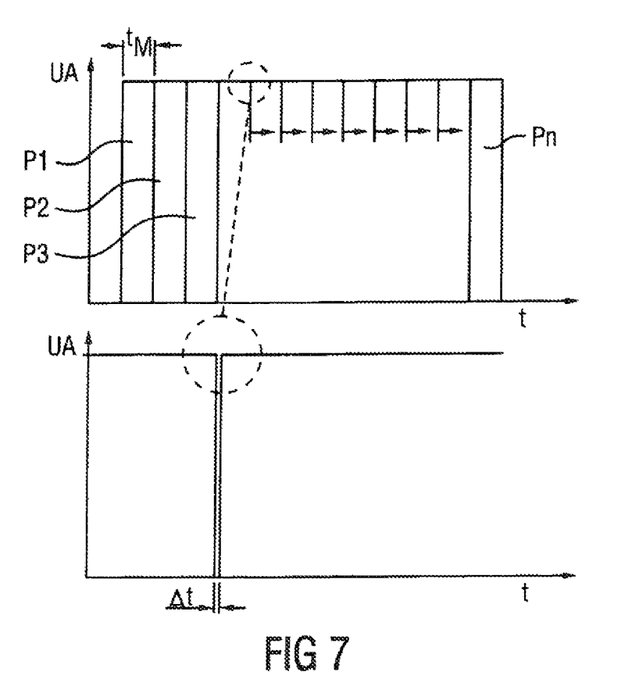
FIG. 7 shows a summation pulse diagram combined from the pulse diagrams according to FIG. 6 and an enlarged view of a detail of the summation pulse diagram.

The top part of FIG. 7 shows the combined summation pulse diagram from the pulse diagrams according to FIG. 6. The number of the module groups MG1, MG2, MG3, MGn is selected so that the first module group MG1 can again output a pulse P1 when the last module group MGn has output its pulse Pn, so that the first pulse P1 again follows the last pulse Pn. The bottom of FIG. 7 shows an enlarged detail of the summation pulse diagram shown above to illustrate that the interval Δt between two high-voltage pulses P1, P2, P3, Pn is much less than the pulse length $t_M$ itself. I.e., the duty ratio of the pulses output at the output A1 of the circuit arrangement 1' is sufficiently high that a quasi-DC voltage only having very brief interruptions at the transition between two high-voltage rectangular pulses P1, P2, P3, Pn is provided.

Finally, it is to be noted once again that the above-described circuit arrangement and the method for supplying a klystron and a kicker magnet are only exemplary embodiments, which can be modified in greatly varying ways by a person skilled in the art in the scope of the claims, without leaving the field of the invention. Furthermore, the use of the indefinite articles "a" or "one" does not preclude that the relevant features can also be provided multiple times.

The invention claimed is:

1. A circuit arrangement for supplying a high-power functional component with high-voltage pulses, comprising:
   two input terminals for applying an input voltage,
   two output terminals for connection to high-voltage terminal contacts of the high-power functional component, a plurality of charge storage modules, which each contain a capacitive element, and which are connected in series via at least one first switching device to the input terminals and via at least one second switching device to the output terminals and, a control device for activating the individual charge storage modules and the first and second switching devices, wherein the charge storage modules and the control device are implemented such that in a charging phase, the first switching device is closed and the capacitive elements of the charge storage modules are connected successively individually or in groups in series to a charging voltage, then in a discharging phase the first switching device is opened and the charge storage modules are disconnected from the charging voltage and the second switching device is closed and at least a part of the capacitive elements of the charge storage modules are discharged to form a voltage pulse, if a high-power functional component is properly connected to the output terminals.

2. The circuit arrangement according to claim 1, wherein the control device for activating the individual charge storage modules and the charge storage modules are implemented such that capacitive elements of the charge storage modules can be switched in and/or out individually or in groups in a controlled manner in the charging phase and/or in the discharging phase to generate a defined voltage pulse.

3. The circuit arrangement according to claim 1 wherein at least a part of the charge storage modules each have separately activatable switching elements, which are implemented and situated so that the capacitive element of a charge storage module is connected to adjacent charge storage modules within the series circuit or to an end point of the series circuit, or the capacitive element of a charge storage module within the series circuit is bypassed.

4. The circuit arrangement according to claim 3, wherein at least a part of the charge storage modules each comprise control units connected to the control device for activating the switching elements.

5. The circuit arrangement according to claim 4, wherein at least a part of the charge storage modules each comprise a measuring unit for measuring a measured value which represents the charge state of the capacitive elements.

6. The circuit arrangement according to claim 4 wherein the control units and/or the measuring units of the charge storage modules are each connected via a non-galvanic connection, preferably via optical waveguides, to the control device.

7. The circuit arrangement according to claim 1, wherein multiple module groups connected in parallel to one another with respect to the input terminals and the output terminals, which each have a plurality of charge storage modules connected in series, which are each connected via at least one first switching device to the input terminals and are each connected via at least one second switching device to the output terminals.

8. The circuit arrangement according to claim 7, wherein the control device) is implemented such that the first switching devices and the second switching devices of various module groups are connected so that the module groups are in a charging phase and a discharging phase offset to one another.

9. The circuit arrangement according to claim 1, wherein at least one of the first switching device and the second switching device comprise a chain of power switches connected in series one after another, preferably thyristors.

10. The circuit arrangement according to claim 1, wherein the high-power functional component comprises a klystron or a kicker magnet.

11. A method for activating a high-power functional component using high-voltage pulses, comprising:
    charging a plurality of charge storage modules, which each contain a capacitive element, in a charging phase, the capacitive elements of the charge storage modules being connected successively individually or in groups in series to a charging voltage,
    disconnecting the charge storage modules from the charging voltage, and
    discharging the charge storage modules in a discharging phase in the form of a defined voltage pulse, at least a part of the capacitive elements of the charge storage modules being connected in series to high-voltage terminal contacts of the high-power functional component.

12. The method according to claim 11, wherein, in at least one of, in the charging phase and in the discharging phase, capacitive elements of the charge storage modules can be switched in or out individually or in groups in a defined manner.

13. The method according to claim 11 wherein the capacitive elements of the charge storage modules are switched in or out in the charging phase and/or in the discharging phase as a function of a currently stored charge in the respective capacitive element.

14. The method according to claim 11, wherein the high-power functional component comprises a klystron or a kicker magnet.

15. A use of a circuit arrangement according to claim 1 for supplying a high-power functional component, in particular a klystron or a kicker magnet.

* * * * *